United States Patent [19]

Chason et al.

[11] Patent Number: 4,639,631
[45] Date of Patent: Jan. 27, 1987

[54] ELECTROSTATICALLY SEALED PIEZOELECTRIC DEVICE

[75] Inventors: Marc K. Chason, Schaumburg; Carl A. Kotecki, Palatine; Joseph P. Tomase, Libertyville; Michael J. Onystok, Bloomingdale; Donald J. Ryback, Northbrook; Robert G. Kinsman, Naperville; Lawrence N. Dworsky, Northbrook; Kenneth J. Nield, Western Springs, all of Ill.; Steven C. Moore, Mountain View, Calif.

[73] Assignee: Motorola, Inc., Schaumburg, Ill.

[21] Appl. No.: 750,455

[22] Filed: Jul. 1, 1985

[51] Int. Cl.⁴ ............................................. H01L 41/08
[52] U.S. Cl. ...................... 310/344; 310/348
[58] Field of Search ................. 310/344, 348, 370

[56] References Cited

U.S. PATENT DOCUMENTS

| | | | |
|---|---|---|---|
| 2,094,287 | 9/1937 | Zimmerman et al. | 49/81 |
| 2,388,242 | 11/1945 | Arndt, Jr. | 171/327 |
| 3,312,540 | 4/1967 | Plumbo et al. | 65/59 |
| 3,397,278 | 8/1968 | Pomerantz | 174/52 |
| 3,663,868 | 5/1972 | Noguchi et al. | 317/234 R |
| 4,047,214 | 9/1977 | Francombe et al. | 357/26 X |
| 4,266,156 | 5/1981 | Kizaki | 310/344 |
| 4,293,986 | 10/1981 | Kobayashi et al. | 29/25.35 |
| 4,354,133 | 10/1982 | Vig | 310/344 |
| 4,362,961 | 12/1982 | Gerber | 310/370 |
| 4,384,899 | 5/1983 | Myers | 148/1.5 |
| 4,445,256 | 5/1984 | Huguenin et al. | 29/25.35 |
| 4,516,430 | 5/1985 | Kurtz et al. | 73/727 |
| 4,565,096 | 1/1986 | Knecht | 361/283 |

FOREIGN PATENT DOCUMENTS

| | | | |
|---|---|---|---|
| 0629358 | 4/1982 | Fed. Rep. of Germany | 310/344 |
| 2002955 | 2/1979 | United Kingdom | 310/344 |
| 2029092 | 3/1980 | United Kingdom | 310/344 |

OTHER PUBLICATIONS

A copy of a data sheet form Epson America, Inc. which relates to a 8640 series programmable clock pulse generator which is manufactured by Suwa Seikosha Co. Ltd.
A data sheet from Statek Corporation for "miniature quartz crystals" for models CX-1H and CX-1V.

Primary Examiner—Mark O. Budd
Attorney, Agent, or Firm—Charles L. Warren; Donald B. Southard

[57] ABSTRACT

A piezoelectric device package consists of a base and a cover which are sealed together to hermetically seal a piezoelectric device such as a quartz crystal therebetween. A recess in the cover receives the quartz crystal. Feedthrough holes in the base, or the cover, or both, which have electrostatic seals formed over them provide a means for making electrical connections with the quartz wafer while still maintaining the hermetic seal.

43 Claims, 9 Drawing Figures

ELECTROSTATICALLY SEALED PIEZOELECTRIC DEVICE

BACKGROUND OF THE INVENTION

This invention relates generally to piezoelectric devices. As used herein, a piezoelectric device includes piezoelectric resonators, filters and surface acoustic wave (SAW) devices. More specifically, this invention is directed to a piezoelectric device disposed in a two piece package which is sealed together to form a hermetic seal. This invention also addresses the problem of making electrical connections with the piezoelectric device through the package, commonly referred to as "feed-through" connections.

Quartz crystal resonators have been used for many years as the frequency controlling element in an oscillator circuit. Because of environmental considerations often associated with electronic equipment and computers, it is usually desirable to protect the crystal resonator within a hermetically sealed package.

One commonly used quartz resonator package consists of a header and a metal container which is sealed to the header. The header consists of a metal frame, a sealing glass contained within the frame, and Kovar pins which pass through the glass to provide electrical connections to a quartz resonator mounted inside the sealed package. These pins and the sealing glass are selected to have generally similar thermal expansion properties so that a hermetic seal of the package is maintained over an operating range of temperatures. While this package has generally proved successful, there exists a demand for a quartz resonator package which can be readily manufactured and more easily handled in accordance with modern manufacturing techniques. For example, a leadless hermetically sealed resonator which could be easily mounted to a printed circuit board by an automatic machine would be desirable.

Various types of resonators with glass containers have been suggested; for example, see U.S. Pat. Nos. 4,293,986, 4,362,961, 4,445,256. The packages disclosed in these patents comprise two halves which are made of glass, or glass and ceramic, and have a recess in one half for receiving a quartz resonator. Such glass packages are bonded together about their periphery by means of a eutectic metal, such as solder. A hermetic seal is formed about the periphery of such a package due to the melting of the deposited eutectic material. However, depositing a eutectic material having a relatively low melting point about the periphery of each half of the glass package may require an intermediate layer of a different material since the desired eutectic material may not directly adhere to the glass.

A significant consideration with respect to a hermetically sealed crystal package is the means by which electrical connections can be brought outside the package while still maintaining the integrity of the hermetic seal. While it is apparent that holes can be formed in the walls of a package, providing a hermetic seal which can be easily and reliably manufactured to permit electrical connections to be made through the hole presents a difficult problem.

SUMMARY OF THE INVENTION

It is an object of this invention to provide an improved hermetically sealed quartz resonator package.

This invention generally contemplates a quartz resonator package consisting of a base and a cover which are electrostatically sealed together to hermetically seal a quartz wafer therebetween. A recess in the base or cover receives the quartz wafer. Feedthrough holes in the base, or the cover, or both, which have electrostatic seals formed around them provide a means for making electrical connections with the quartz wafer while still maintaining the hermetic seal. Additional details concerning resonators according to the present invention will be apparent from the following description.

BRIEF DESCRIPTION OF THE DRAWINGS

The same reference numerals in the different figures refer to common elements.

DESCRIPTION OF EMBODIMENTS

Figure 1:
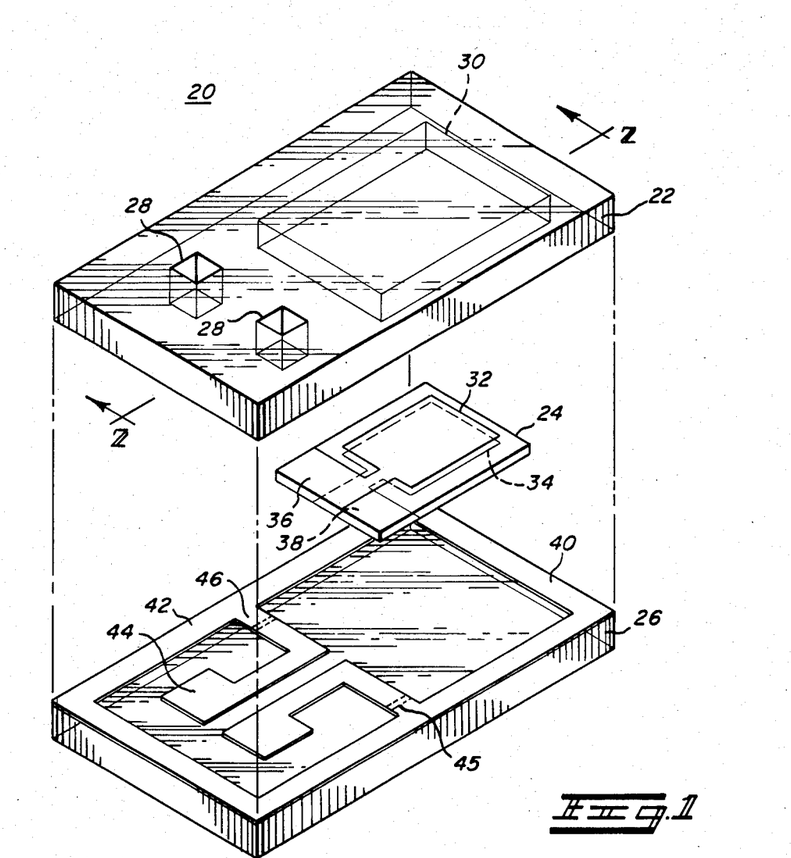
FIG. 1 is an exploded view of a quartz resonator and package according to the present invention.
Figure 2:
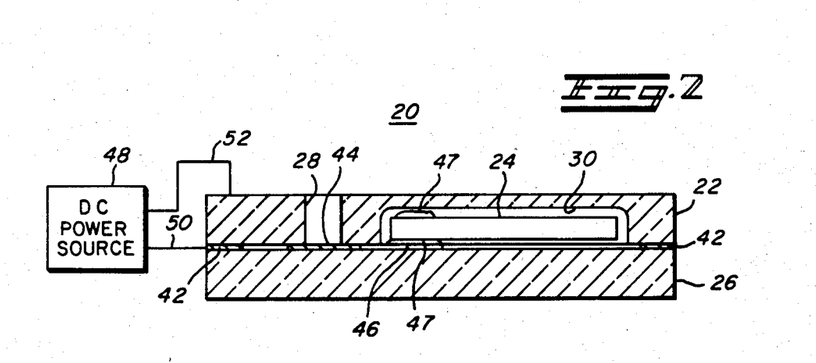
FIG. 2 is a cross sectional view taken along line 2—2 in FIG. 1.

Referring to FIGS. 1 and 2, an embodiment of a quartz resonator package 20 according to the present invention includes a cover 22, a quartz wafer 24, and a base 26. The cover 22 is preferably made of glass and contains spaced-apart holes 28. A recess 30 in the cover 22 is dimensioned to receive the quartz wafer 24 when the cover 22 is secured to base 26.

The illustrated quartz wafer 24 may consist of an AT strip resonator which includes plated electrodes 32 and 34 disposed on opposite surfaces. One end of wafer 24 may include metal connection pads or areas 36 and 38 which are connected to the metal electrodes 32 and 34, respectively. The pad 36 is on the top surface of wafer 24 as seen in FIG. 1 and pad 38 is on the bottom surface.

The base 26 is also preferably made of glass and has a pattern of metal 40 disposed on the surface which mates with cover 22. The illustrated metal pattern 40 includes a continuous portion 42 about the periphery of base 26, adjacent spaced-apart metal pads or areas 44, and connecting strips 46 which connect the pads 44 with the periphery 42. The respective pads 44 are positioned on base 26 so as to be in alignment with holes 28 in cover 22. The area of each metal pad 44 is larger than the area of the corresponding holes 28 so as to completely surround each hole. The two strips 46 are positioned to align with the metal connection areas 36 and 38 on wafer 24. Electrical connections to the electrodes 32 and 34 can be made by pads 44 which are accessible through holes 28.

The method of manufacture of a quartz resonator package 20 and additional details with respect to the package are provided below.

The holes 28 and recess 30 in the glass cover 22 can be formed by etching or machining a glass plate, or hot stamping the glass in a molten state to the desired configuration.

The glass base 26 may consist of a glass plate of substantially uniform thickness. The metallization 40 can be formed in various ways. A thin film deposition technique can be utilized to deposit a uniform layer of metal over the entire upper surface of base 26. Then, utilizing conventional photolithographic techniques the metallized surface can be etched to produce the desired pattern. An alternate method is to bond a thin sheet of metal foil, such as 0.5-6 mil thick, to one surface of the base 26. The desired pattern then can be achieved by photolithographic etching techniques. The use of aluminum as the metal foil has proven successful, but other metals could be used. Of course, instead of etching away portions of the metal foil, a foil pattern stamped to have the desired configuration could be formed and transferred directly onto the surface of base 26. The use of a metal foil of the suggested thickness is generally preferred over the thin film metal deposition approach because the former provides a greater latitude with respect to the smoothness of the surfaces of the base and cover. Since the formation of a hermetic seal between the cover and base is dependent upon the contiguous engagement of the base, the metal, and the cover, the use of a metal foil is preferred so that greater variations in the surface of the glass can be accomodated. Also the end of a hole can be covered and sealed by a metal foil.

The present invention contemplates hermetically sealing the cover 22 to base 26 and the access holes by the formation of an electrostatic or anodic bond. It is possible to form a very good bond between a metal and glass, such as borosilicate, soda-lime-silica, or aluminosilicate glass. The bond is formed by applying a substantial DC voltage between the metal and glass while same are in contact, and elevating the temperature of the materials. Although glass is an insulator over the operational temperature range of piezoelectric devices, it becomes increasingly conductive as the temperature increases. Thus, at elevated temperatures it is possible to pass a small current between the metal and glass which is believed to cause the migration of the metal into the glass at the interface therebetween to create a bond. This technique is utilized to effectuate a hermetic seal between the glass cover 22 and base 26. This bonding technique is explained in more detail in U.S. Pat. No. 3,397,278 which is entitled "Anodic Bonding".

It is important to understand the materials normally used to fabricate the quartz wafer 24 since the characteristics of the materials provide limits, especially with respect to the maximum temperature that the package can be subjected. Quartz tends to degrade at a temperature approaching 573° centigrade. However, commonly used technology in forming metal patterns 32 and 34 provide additional temperature limits. Because of difficulties in depositing gold directly upon the quartz wafer, an intermediate layer of chromium is commonly used. Generally, a layer of chromium is deposited upon the wafer and a layer of gold is then deposited upon the chromium such that the gold and chromium do not react with each other to form a new alloy. At temperatures greater than 300° centigrade, the chromium/gold patterns on the quartz wafer 24 begin to degrade thereby negatively influencing the performance of the crystal. One aspect of this invention is the recognition of the temperature limitations associated with the quartz wafer 24 and the discovery that a range of temperatures and voltages can be utilized to create an effective electrostatic bond without substantial adverse deterioration of the quartz wafer or its metallization.

Once the metal pattern 40 is disposed on base 26, the quartz wafer 24 is positioned on the base such that metal areas 36 and 38 on the wafer are adjacent the respective strips 46. The electrical connection between the metal areas 36 and 38 on the wafer 24 and the strips 46 can be accomplished by the use of conductive cement or conductive epoxy 47. For example, a small quantity of the epoxy 47 can be placed on the near strip 46 (as viewed in FIG. 1) so that it is disposed between this strip and metal area 38 on wafer 24. Another quantity of the epoxy 47 is disposed on the upper surface at metal area 36 and allowed to flow over the edge of the wafer 24 to engage the other strip 46. Thus, electrical connections between the electrodes on the crystal and the enlarged metal pads 44 on base 26 is accomplished. The epoxy also holds the wafer so that a slight separation between the bottom surface of wafer 24 and the surface of glass base 26 exists. This is desired to prevent unwanted damping of oscillations of the wafer during operation. Of course, other separate spacers could also be used to help support and stabilize the resonator.

After the wafer 24 is mounted, the cover 22 is seated upon the metal areas 40 on base 26 so that the quartz wafer 24 is received within recess 30. The cover is maintained in alignment and contact with the metal areas 40 and the assembled package 20 is heated, such as in a temperature controlled oven, to an elevated temperature. A DC power source 48 is connected such that its positive terminal 50 is connected to metal strip 42 and its negative terminal 52 is connected to the glass cover 22. A voltage is applied to the elevated temperature package 20 for a time sufficient to create a seal between the metal areas 40 and the area of cover 22 in contact with the metal areas. Following this process the cover and base have been sealed together about their perimeter by means of metal strip 42 and about the holes 28 by the metal areas 44 thereby forming a hermetically sealed package.

The strips 46 have been utilized to provide electrical conductivity between metal areas 44 and 42 so that the DC voltage used during the bonding process is applied to all metal areas. However, it will be apparent to those skilled in the art that the electrodes on wafer 42 are effectively short circuited since the runners 46 are connected to each other by means of the peripheral metal strip 42. After the package has been sealed, the strips 46 are severed near their respective junctions of the peripheral metal strip 42 by means of a laser beam to define transverse, non-conductive intervals 45. Thereafter, the electrodes 32 and 34 on wafer 24 are connected only to the respective metallized areas 44. The holes 28 in cover 22 provide access to metal areas 44 which serve as electrical pads by which conventional electrical connections can be made. Since the holes 28 abut areas 44 and the periphery of each hole is sealed to these metal pads, the hermetic seal of the wafer is maintained.

Figure 3:
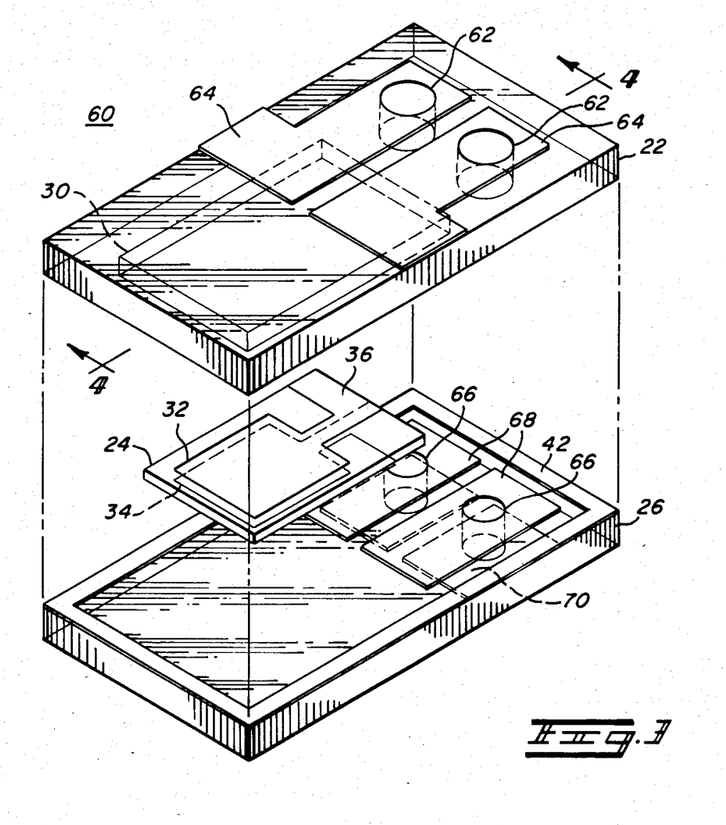
FIG. 3 is an exploded view of another embodiment of the present invention.
Figure 4:
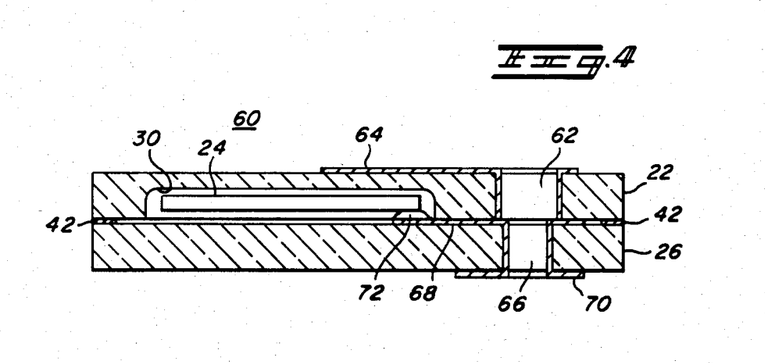
FIG. 4 is a cross sectional view taken along line 4—4 of FIG. 3.

FIGS. 3 and 4 illustrate another embodiment of a resonator package 60. In this embodiment cover 22 contains two circular holes 62 and spaced-apart areas of plating 64 on the outside surface of the cover which surround the respective holes 62.

The base 26 includes circular holes 66 which are disposed to align with holes 62 as seen in FIG. 4. Areas of plating 68 surround each of the holes 66 on the upper surface of base 26. On the other surface of base 26 generally opposite to plating areas 68, spaced-apart plating areas 70 also surround holes 66.

The inside surfaces of holes 62 and 66 are preferably plated so that the respective pairs of plating areas 64, 68, and 70 are electrically connected together when the package is assembled as shown in FIG. 4. The areas of plating 64, 68, and 70 can be secured to the cover and base by electrostatically bonding the metal areas to the glass members or by a thin film metal deposition process. With respect to plating holes 62 and 66, a thin film metal deposition technique can be utilized.

The electrodes 32 and 34 of the quartz wafer 24 are connected to the respective areas of metal 68 by the use of a conductive epoxy 72 which also holds the wafer 24 spaced-apart from the base. After the resonator wafer 24 is mounted to base 26, the cover 22 and base 26 are assembled together as seen in FIG. 4 and the metal areas 42 and 68 on base 26 are electrostatically sealed to the corresponding glass surfaces on cover 22 thereby creating a hermetic seal for the resonator wafer 24. Although respective pairs of holes 62 and 66 provide passages through the completed package 60, these passages do not interfere with the formation of a hermetic seal since the surrounding metal areas 68 form an effective seal to isolate the holes from the interior of the package.

The pairs of metal areas 64 and 70 provide access for making electrical connections with the electrodes on the resonator wafer 24 from either side of package 60. For example, the metal areas 70 on base 26 could be directly mounted, such as by soldering, to corresponding metal areas on a printed circuit board and additional components could be mounted to the areas 64. In such a mounting, areas 64 would also provide conductive areas which could be probed for testing purposes. Because the pairs of holes 62 and 66 provide passages completely through the package 60, a so-called "blind" hole is avoided. A blind hole is one which has access from only one opening. During the manufacturing processes, a blind hole may collect unwanted residues which could adversely effect the electrical performance of the resonator or degrade the seal of the package. The through passages formed in package 60 minimizes such problems by eliminating blind holes.

Figure 5:
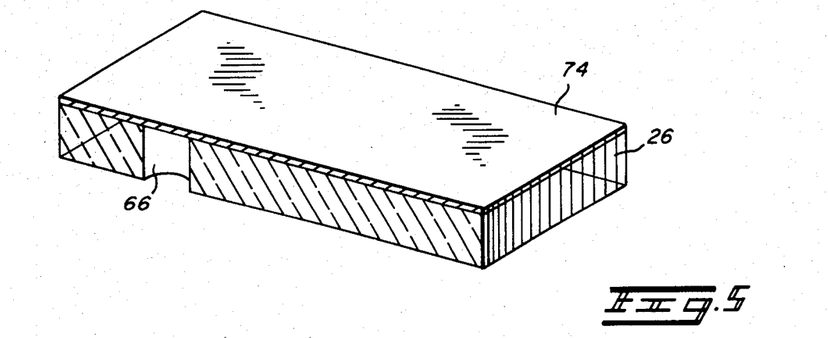
FIGS. 5, 6 and 7 are partial perspective views of one part of a resonator package according to the present invention illustrating different stages in its manufacture.
Figure 6:
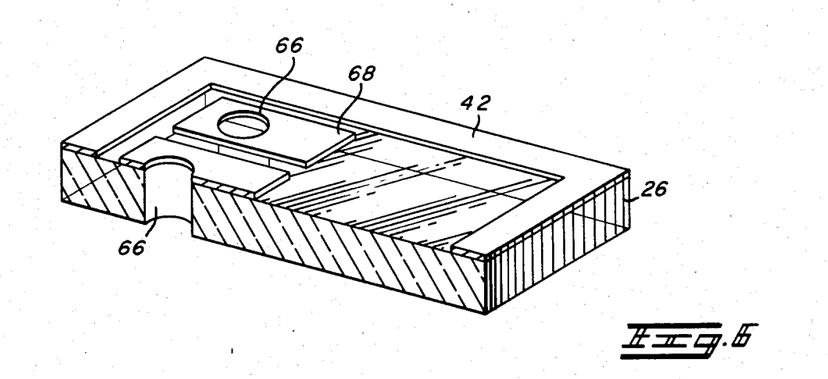
Figure 7:
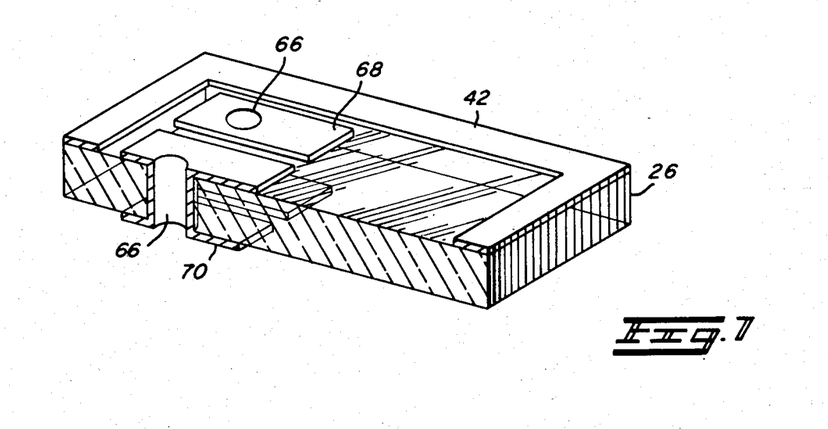

FIGS. 5, 6, and 7 illustrate various stages during the manufacture of a base 26 as used in package 60. As seen in FIG. 5, a sheet of thin metal foil 74, such as aluminum, is bonded to cover one entire surface of the base. Prior to the metalization of the base, holes 66 were drilled or otherwise formed. The metal foil 74 is preferably electrostatically bonded to base 26.

In FIG. 6, the base 26 has been further processed by the removal of selected areas of metal to leave a continuous peripheral strip 42 and spaced-apart areas of metal 68 surrounding holes 66. The removal of the undesired metal can be accomplished by utilizing conventional photolithographic techniques to chemically etch it away.

In FIG. 7, the base has been further processed to add plating to holes 66 and to add additional areas of metalization 70 surrounding holes 66 and generally opposite metal areas 68. This additional metalization can be accomplished by utilizing a thin film metal deposition technique. Alternatively, the metal inside holes 66 could be deposited by thin film metal deposition techniques and the metalized area 70 could be accomplished by electrostatically bonding metal to the bottom surface of base 26.

Figure 8:
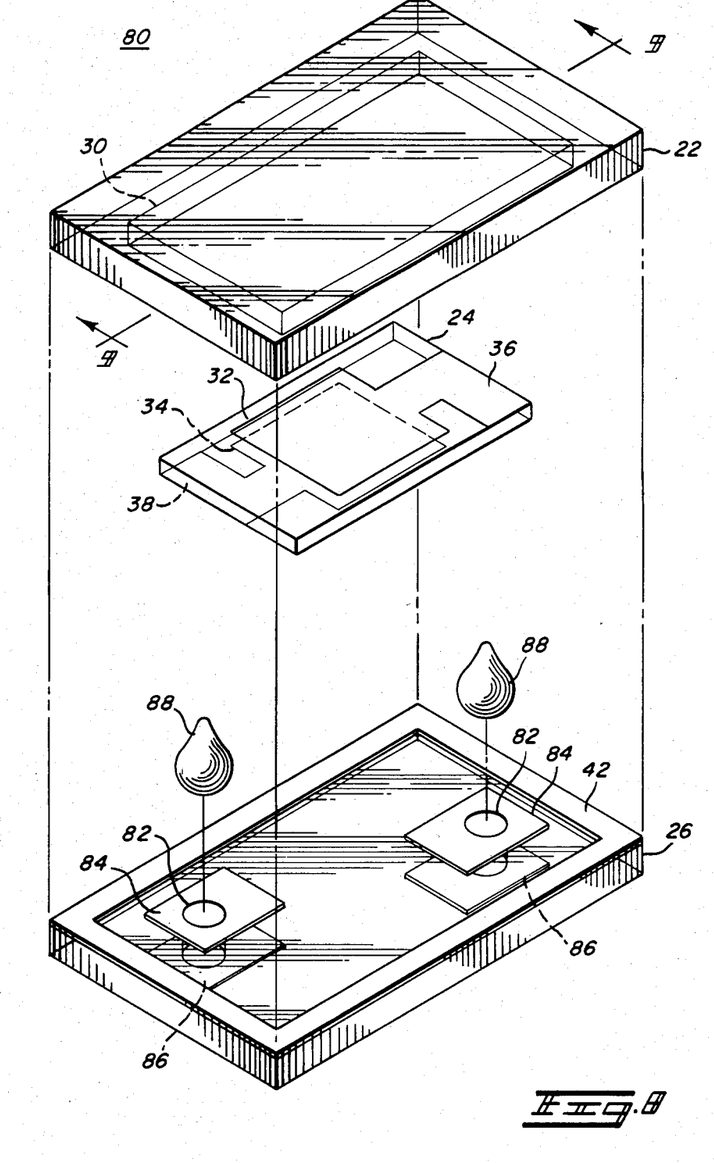
FIG. 8 is an exploded view of another embodiment of a resonator according to the present invention.
Figure 9:
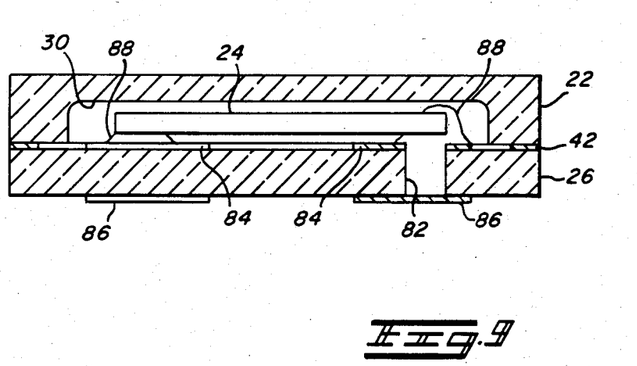
FIG. 9 is a cross sectional view taken along line 9—9 in FIG. 8.

FIGS. 8 and 9 illustrate another embodiment of a resonator package 80 which also includes cover 22, resonator wafer 24, and base 26. In this embodiment, the metal areas 36 and 38 on resonator wafer 24 which are utilized for connection to the electrode patterns 32 and 34, respectively, are disposed at opposite ends of the wafer.

The holes 82 in base 26 are disposed to be generally adjacent the metal areas 36 and 38 on the resonator wafer 24. Areas of metal 84 are adjacent and surround the holes 82. Areas of metal 86 are disposed generally opposite patterns 84 on the opposite surface of base 26 and enclose (cover) the respective ends of holes 82. The metal areas 86 form a hermetic seal over the holes 82.

In the manufacture of package 80, the base 26 will have holes 82 formed and all metalization (42, 84, 86) will be disposed thereon prior to assembly with the resonator wafer 24 and cover 22. Drops of conductive epoxy 88 are inserted into holes 82 with an amount of the epoxy permitted to stand slightly above the hole as seen in FIG. 9. The wafer 24 is then seated upon the base such that the respective ends of the wafers are supported by the pools of epoxy. Alternatively, the epoxy can be allowed to fully cure and a small amount of additional epoxy can be used to fasten the wafer to the cured epoxy. In order to insure that metal pad 36 on the upper surface of the wafer 24 establishes electrical contact, a small additional quantity of epoxy may be disposed upon the upper surface of wafer 24 on pad 36 and allow to extend over the edge of the wafer to engage the epoxy which extends into the respective hole 82. The conductive epoxy serves two purposes. First, the epoxy mounts the wafer to the base and holds it into a position slightly elevated above the base so that the active surface of the wafer is not in contact with the base. Second, the epoxy establishes electrical connection between the electrodes on the resonator wafer and external metalized pad areas 86. Connections between the electrodes on the wafer and metal pads on the base could be made with a wire bond, directly soldering same, or other known means. After the resonator wafer is mounted to the base, the cover 22 is seated upon peripheral metal ring 42 and an electrostatic bond is formed thereby sealing the cover to the base. The external pads can be mounted to a printed circuit board by conventional means.

Specific embodiments of this invention have been made using borosilicate glass and aluminum foil. For example, foil having a thickness of 0.0015–0.006 inches can be electrostatically bonded to a plate of borosilicate glass by applying a DC voltage of 60–1000 volts while heated between 200°–500° C. for 20–30 minutes. For a temperature within this range, the voltage is preferably selected to produce a current density of approximately 0.00015 amperes per square inch.

A piezoelectric AT resonator has been successfully sealed between a cover and base made of borosilicate glass in which the base had already bonded to its mating surface aluminum foil of 0.005 inches thick. After the resonator was mounted to the pads on the base by conductive epoxy, the cover was seated on the base and the assembly was heated to 300° C. at atmospheric pressure. A voltage in the range of 400–800 volts was applied to produce a current density of 0.00015 amperes per square inch for 30 minutes. Of course, an inert gas atmosphere could be used during the sealing process if desired.

Although glass is a preferred material, other materials which are compatible with electrostatic bonding could be utilized. For example, since the cover in package 80 functions only as a cover, it could be made of metal thereby eliminating the need for metal strip 42. A resonator package could also be formed having one hole for establishing connection to one of the electrodes on the wafer and the other electrical connection to the wafer being established by means of electrical connection established with the peripheral metalization 42. For example, one of the holes 28 in package 20 as seen in FIG. 1 could be omitted by permitting the corresponding metal conductor 46 to remain connected with peripheral metalization 42. The other metal runner 46 associated with the other remaining hole 28 would be severed as explained with respect to FIG. 1. Thus, connection could be made to the electrodes by attaching a wire to the pad 44 corresponding with the remaining hole 28 and the other connection could be made by establishing electrical connection with respect to metal layer 42 which could have a tab extending beyond the package for making a convenient connection.

With respect to the manufacture of resonator packages, small quantities of such resonators can be manufactured individually. However, the manufacture of such devices in quantity would likely utilize a batch wafer approach such as utilized in the semiconductor industry. That is, a large number of bases could be formed on a single substrate and a corresponding number of covers formed on a different substrate such that the respective covers and bases would be in alignment with each other. After insertion of the resonator wafers onto the base, the substrate carrying the covers could be seated upon the substrate carrying the respective bases and the electrostatic processing completed. The individual resonator packages could then be separated after having been tested for electrical performance.

The use of a glass cover or a glass base allows the sealed resonator package to be trimmed to a precise frequency by the use of a laser. For example, the effective area of the electrodes on the resonator wafer after being sealed within a package could be effectively reduced by burning a portion of the metal away with a laser beam. This would cause a corresponding change in the frequency of the resonator and would permit the active tuning of a sealed package to the desired frequency.

A laser beam could also be used to hermetically seal a cover to a base. For example, the cover 22 in package 80 could be sealed to the base by a laser beam after the wafer 24 is mounted to the base. In this case, the metal strip 42 could be omitted and a laser beam directed about the adjoining peripheral edges of the cover and base to melt a small amount of material from each to form a seal. The feedthrough holes 82 would be sealed by the electrostatically bonded pads 86. Sealing the cover to the base by application of a laser beam has the advantage that the wafer 24 is not subjected to an elevated temperature since only localized heating is generated by the laser sealing process.

Although embodiments of the present invention have been explained and illustrated in the drawings, the scope of the invention is defined in the claims appended hereto.

We claim:

1. A hermetically sealed piezoelectric device package comprising:
   a base and cover which are insulators within the operating temperature range of the device;
   piezoelectric device mounted between said base and cover and having first and second electrodes;
   means for providing electrical connections outside of said package with said first and second electrodes, said connection means including at least a first hole disposed in one of said base and cover and a first metal pad electrically connected to said first electrode, said pad contiguously abutting the periphery of said first hole;
   means for electrostatically sealing said cover to said base to hermetically seal said device in the package, said sealing means including a strip of metal disposed contiguous to the periphery of said base and cover, said sealing means utilizing said first pad to form an electrostatic seal about said first hole and utilizing said strip of metal to form a seal about the periphery of said cover and base, thereby hermetically sealing the piezoelectric device inside the package.

2. The package according to claim 1 further comprising a second hole spaced apart from said first hole on said one of the base and cover, and a second metal pad electrically connected to said second electrode, said second pad contiguously abutting the peripery of said second hole, said sealing means utilizing said second pad to form a seal about said second hole.

3. The package according to claim 1 further comprising conductive cement utilized to connect said one electrode to said first metal pad, said cement also serving to mount said piezoelectric device to said base.

4. The package according to claim 1 wherein said base and cover are made of a glass which is suitable for electrostatic bonding.

5. The package according to claim 1 further comprising means for electrically connecting said first metal pad to said peripheral strip of metal during the electrostatic bonding of said first pad to the peripheral of said first hole.

6. The package according to claim 5 wherein said electrically connecting means comprises a metal conductor, and further comprising means for severing said metal conductor after the electrostatic bonding of said first pad to the periphery of said first hole to electrically isolate said first pad from said peripheral strip of metal.

7. The package according to claim 6 wherein said severing means comprises the application of a laser beam to said metal conductor.

8. The package according to claim 2 further comprising first and second metal conductors connecting said first and second pads, respectively, to said peripheral strip of metal to facilitate the electrostatic bonding of said first and second pads to the periphery of said fist and second holes, respectively.

9. The package according to claim 8 further comprising means for severing each of said first and second metal conductors to electrically isolate said first and second pads from said peripheral strip of metal.

10. The package according to claim 9 wherein said means for severing comprises the application of a laser beam to said first and second conductors.

11. The package according to claim 1 further comprising a second hole disposed in the other of the base and cover generally opposite said first hole, said first pad surrounding the periphery of said second hole, whereby said first and second holes cooperate to define a passage through the resonator package.

12. The package according to claim 11 further comprising a third hole disposed in said one of the base and cover, and a fourth hole disposed in the other of said base and cover opposite said third hole, a second metal pad electrically connected to said second electrode, said second pad contiguously surrounding the periphery of said third and fourth holes, whereby said third and fourth holes define another passage through the resonator package.

13. The package according to claim 1 further comprising metal plating covering the wall of said first hole and electrically connected to said first metal pad.

14. The package according to claim 11 wherein at least one of said first and second holes have metal plating on its walls in electrical connection with said first pad.

15. The package according to claim 12 wherein one of said first and second holes and one of said third and fourth holes each have metal plating disposed about its walls providing electrical connection with said first and second pad, respectively.

16. The package according to claim 1 wherein said electrical connection means comprises a conductive cement disposed within said first hole and in contact with said first pad to provide an outside electrical connection with said first electrode.

17. The package according to claim 2 wherein said electrical connection means comprises conductive cement disposed in said first and second holes, said cement in each respective hole in contact with said first and second pads, respectively, whereby the cement in each hole provides electrical connection outside of said package to said first and second electrodes.

18. The package according to claim 1 further comprising a third metal pad disposed adjacent said first hole on the external surface of said resonator package, and means for establishing electrical connection between said first and third pads.

19. The package according to claim 2 further comprising third and fourth metal pads on an outside surface of said resonator package adjacent said first and second holes, respectively, and means for connecting said first and second pads to said third and fourth pads, respectively, thereby providing external electrical connections to said first and second electrodes.

20. The package according to claim 18 wherein said means for connecting said first and third pads comprise metal plating disposed on the wall of said first hole.

21. The package according to claim 18 wherein said means for connecting said first and third pads comprises conductive cement disposed in said first hole and in contact with said first and third pads.

22. The package according to claim 19 wherein said means for establishing electrical connections between said first and second pads and said third and fourth pads, respectively, comprises metal plating disposed on said first and second holes.

23. The package according to claim 19 wherein said means for establishing electrical connection between said first and second pads and said third and fourth pads, respectively, comprises conductive cement disposed in said first and second holes.

24. The package according to claim 11 further comprising a second metal pad disposed adjacent said first hole on the exernal surface of said package, and a third metal pad disposed adjacent said second hole on an exernal surface of said package, and means for establishing electrical connection between said first, second, and third pads.

25. The package according to claim 12 further comprising a third metal pad disposed adjacent said first hole on an external surface of said package, fourth metal pad disposed adjacent said second hole on an external surface of said package, means for establishing electrical connection between said first, third, and fourth pads, a fifth metal pad disposed adjacent said third hole on an external surface of said package, a sixth metal pad disposed adjacent said fourth hole on an external surface of said package, and means for establishing electrical connection between said second, fifth, and sixth pads.

26. The package according to claim 24 wherein said means for establishing electrical connection between said first, second and third pads comprises metal plating disposed on the walls of said first and second holes.

27. The package according to claim 24 wherein said means for establishing electrical connection between said first, second and third pads comprises a conductive cement disposed in said first and second holes and in electrical contact with said first pad which is electrical connected with said first electrode.

28. The package according to claim 12 wherein said first and second holes are disposed adjacent one end of said piezoelectric device, and said third and fourth holes are disposed adjacent the opposite end of said piezoelectric device.

29. The package according to claim 2 wherein said first hole is disposed adjacent one end of said piezoelectric device and said second hole is disposed adjacent the opposite end of said piezoelectric device.

30. The package according to claim 1 wherein said metal pad completely covers an end of said first hole.

31. The package according to claim 30 wherein said metal pad is disposed on an interior surface of said one of said base and cover.

32. The package according to claim 30 wherein said metal pad is disposed upon the exterior surface of said one of said base and cover.

33. A hermetically sealed piezoelectric device package comprising:
  a base and cover, said base being an insulator within the operating temperature range of the device;
  piezoelectric device mounted between said base and cover and having first and second electrodes;
  means for providing electrical connections outside of said package with said first and second electrodes, said connection means including at least a first hole disposed in one of said base and cover and a first metal pad electrically connected to said first electrode and electrostatically sealed to said one of the cover and base over said first hole to hermetically seal said first hole; and
  means for sealing the periphery of said cover to said base to hermetically seal said device in the package.

34. The package according to claim 33 wherein said sealing means comprises an electrostatic seal formed about the periphery of said base and cover.

35. The package according to claim 34 wherein said sealing means comprises a strip of metal disposed contiguous between the peripheries of said base and cover.

36. The package according to claim 33 further comprising a second hole spaced apart from said first hole on said one of the base and cover, and a second metal pad electrically connected to said second electrode and electrostatically sealed to said one of the base and cover over said second hole to hermetically seal said second hole.

37. The package according to claim 33 further comprising conductive cement utilized to connect said one electrode to said first metal pad, said cement also serving to mount said piezoelectric device to said base.

38. The package according to claim 33 wherein said base and cover are made of a glass which is suitable for electrostatic bonding.

39. The package according to claim 35 further comprising means for electrically connecting said first metal pad to said peripheral strip of metal during the electrostatic bonding of said first pad over said first hole.

40. The package according to claim 39 wherein said electrically connecting means comprises a metal conductor, and further comprising means for severing said metal conductor after the electrostatically bonding said first pad to electrically isolate said first pad from said peripheral strip of metal.

41. The package according to claim 40 wherein said severing means comprises the application of a laser beam to said metal conductor.

42. A hermetically sealed piezoelectric device package comprising:

a base and cover, said base being an insulator within the operating temperature range of the device;

piezoelectric device mounted between said base and cover, and having first and second electrodes;

means for providing electrical connections outside said package with said first and second electrodes, said electrical connection means comprising first and second holes in one of said base and cover, and first and second metal pads contiguous to the periphery of said first and second holes respectively and abutting the other of said base and cover;

means for electrostatically sealing the periphery of said cover to the periphery of said base, said electrostatically sealing means using said first and second pads to seal said first and second holes, respectively.

43. The package according to claim 42 wherein said electrical connection means comprises means for electrically coupling said first and second pads to said first and second electrodes, respectively.

* * * * *